United States Patent
Isokawa et al.

[19]

[11] Patent Number: 6,121,637
[45] Date of Patent: Sep. 19, 2000

[54] SEMICONDUCTOR LIGHT EMITTING DEVICE WITH INCREASED LUMINOUS POWER

[75] Inventors: Shinji Isokawa; Hidekazu Toda, both of Kyoto, Japan

[73] Assignee: Rohm Co., Ltd., Kyoto, Japan

[21] Appl. No.: 09/165,284

[22] Filed: Oct. 2, 1998

[30] Foreign Application Priority Data

Oct. 3, 1997 [JP] Japan ................................. 9-271036
Feb. 3, 1998 [JP] Japan ................................. 10-060296

[51] Int. Cl.$^7$ ................................. H01L 33/00
[52] U.S. Cl. ................................. 257/99; 257/100; 257/98
[58] Field of Search ................................. 257/99, 100, 79, 257/98

[56] References Cited

U.S. PATENT DOCUMENTS

5,173,759  12/1992  Murano ................................. 257/93
5,798,536   8/1998  Tsutsui ................................. 257/99

FOREIGN PATENT DOCUMENTS

9-135040  5/1997  Japan .

*Primary Examiner*—Minh Loan Tran
*Attorney, Agent, or Firm*—Arent Fox Kintner Plotkin & Kahn, PLLC

[57] ABSTRACT

In a chip-type light emitting device in which first and second terminal electrodes are formed on both ends of an insulating substrate with a light emitting device chip being mounted on the surface side, the LED chip is directly formed on the insulating substrate, and at least a portion of the insulating substrate on which the LED chip is mounted is formed by a whitish material. Alternatively, in a lamp-type semiconductor light emitting device in which the LED chip is mounted on the top of a lead, and is covered with a dome-shaped package, or in a chip-type semiconductor light emitting device, a bonding material used for bonding the LED chip is made of a whitish material. Therefore, it becomes possible to reflect light that proceeds toward the back surface side of the LED chip efficiently, and consequently to increase the necessary luminosity even if the light-emitting efficiency inside the LED chip remains the same.

10 Claims, 4 Drawing Sheets

SEMICONDUCTOR LIGHT EMITTING DEVICE WITH INCREASED LUMINOUS POWER

FIELD OF THE INVENTION

The present invention relates to a semiconductor light emitting device, such as a small-size chip-type light emitting device that is constituted by a light emitting chip bonded to the surface of a flat substrate, or a lamp-type light emitting device in which a light emitting chip is bonded into a curving recessed section formed in the top of a lead with its peripheral portion being covered with a dome-shaped package. More specifically, the present invention concerns a light emitting device that can increase the luminous power that is released from the light emitting chip and thus improve the luminosity.

BACKGROUND OF THE INVENTION

Along with the miniaturization of portable apparatuses such as portable telephones and PHS, there are ever-increasing demands for light weight and compactness of light emitting devices and other devices used therein, and small-size thin chip-type light emitting devices have been developed.

As illustrated in FIG. 5(a), in the small-size, thin, and chip-type light emitting device, terminal electrodes 1 and 2 are formed on both ends of a substrate 10, a light emitting chip (hereinafter, referred to as LED chip) 3 is die-bonded by silver paste, transparent epoxy resin, etc. onto an electrode electrically connected with one of the terminal electrodes 1 so as to form one part of the terminal electrode, with its lower electrode being directly connected to the terminal electrode 1 and its upper electrode being wire-bonded to the other terminal electrode 2 by a gold wire 4; thus, the respective parts are electrically connected. An insulating substrate, made of a material such as, for example, a BT resin material in which a glass cloth is impregnated with a heat-resistant BT resin, is used as the substrate 10. Moreover, for example, as illustrated in FIG. 5(b), a pn junction face (light emitting layer) 43 is formed by joining an n-type semiconductor layer 41 made of GaAs, Gap, etc. to a p-type semiconductor layer 42, and electrodes 44 and 45 are formed on the respective surfaces thereof; thus, the LED chip 3 is formed. A package 6, which covers and protects the LED chip 3 and the gold wire 4, is formed on the surface of the substrate 10 by a resin such as a transparent or milky-white epoxy resin.

Along with the development of light, thin, and small-size electronic apparatuses as described earlier, there have been strong demands for further miniaturized chip-type light emitting devices and for LED chips made as small as possible. Further, with respect to those devices, high performance and high luminosity have also been demanded. Here, the conventional chip-type light emitting device is manufactured by mounting and wire-bonding it on the surface of one of the terminal electrodes as described above. Since these terminal electrodes are formed by applying gold plating onto copper patterns, they tend to absorb light that has reached the back side of the substrate of the LED chip 3. In particular, in the case of bluish-colored LED chips which use sapphire substrates, light reaches the back side without being attenuated so much, and the light that has reached the back side tends to be absorbed since bluish lights are easily absorbed, in particular, by yellowish (gold) colors. The resulting problem is that light emitted by bluish-colored LED chips is not utilized efficiently.

As illustrated in FIG. 6(a) that is a partial cross-sectional front view, a lamp-type light emitting device is constructed as follows: A pair of leads 11 and 12, which are made of an iron material to which silver plating is applied, are installed, a mount section 15 is formed on the top portion of one of the leads 12, and a recessed section 15b is formed virtually in the center of the mount section 15. A LED chip 3 is die-bonded to the inside of the recessed section 15b by using a bonding material such as silver paste or transparent epoxy resin. With respect to the LED chip 3, a chip having a red, green or other color, which is provided with upper and lower electrodes, is used. Here, in FIG. 6(a), a bluish-colored LED chip, which is constructed by stacking layers made from a gallium nitride based compound semiconductor such as GaN on a sapphire substrate, is exemplified. Therefore, two electrodes are installed on the upper surface side, and electrically connected to the pair of leads 11 and 12 respectively by metal wires 4 such as gold wires. Further, the peripheral portion is molded by a transparent or translucent (transparent to light-emitting wavelengths of the LED chip) synthetic resin so that a package 18 made of the resin is formed. This package 18 is provided with a lens section 18a having a virtually hemispherical shape on its top portion.

The back surface of the LED chip 3 is bonded by a bonding material 20 such as silver paste or transparent epoxy resin, and light proceeding toward the back surface side is reflected as shown in FIG. 6(b). Light, emitted from the LED chip 3, mostly proceeds straight forward from the top surface, is refracted by the lens section 18a of the package 18, and further emitted outward while being converged in the direction of the center axis. One portion of the light emitted from the LED chip 3 proceeds toward the back surface of the LED chip 3 (refer to E), and is reflected by the bonding material 20 or the bottom surface of the recessed section 15b, thereby forming reflected light R. The reflected light R also proceeds forward from the top surface of the LED chip 3, is refracted by the lens section 18a and emitted outward.

The conventional lamp-type light emitting device has such a structure, and in the case when silver paste is used as the bonding material 20, the light E, which has proceeded toward the back surface side, is reflected by the silver paste. In the case when a transparent epoxy resin is used as the bonding material 20, it passes through the bonding material 20, and is reflected by the silver plating 15a of the bottom surface of the recessed section 15b. However, the reflection rate of the silver paste or silver plating is not so great. For this reason, the light that has proceeded toward the bottom surface side of the LED chip 3 is not utilized efficiently, resulting in a problem in which the efficiency of light to be emitted outward is not enhanced sufficiently.

Moreover, the thermal conductivity $\lambda$ (cal/(m.h.deg)) of silver is in the range of 300 to 400, while that of epoxy resin is 0.27. Therefore, when a LED chip is die-bonded to a fitting member by a transparent epoxy resin, heat radiation from the light emitting device is not carried out favorably, occasionally resulting in discoloration of the transparent epoxy resin. Such discoloration of the transparent epoxy resin also causes an increase in the loss of light that is emitted from the LED chip.

SUMMARY OF THE INVENTION

The present invention has been devised to solve the above-mentioned problems, and its object is to provide a semiconductor light emitting device which can utilize light emitted from the LED chip as effectively as possible by even reflecting light that has been emitted from the LED chip and proceeded toward the substrate side, that is, the back surface side, and enhance the luminosity by increasing the external light-emitting efficiency, that is, a ratio of light to be emitted outward.

Another object of the present invention is to provide a semiconductor light emitting device which can release heat from the LED chip efficiently by using a material having a high thermal conductivity as a bonding material of the LED chip and maintain a high reflection rate while preventing discoloration of the bonding material.

The chip-type semiconductor light emitting device of the present invention is provided with: an insulating substrate; first and second terminal electrodes that are placed at both ends of the surface of the insulating substrate, with at least a portion of the surface of the insulating substrate located between the first and second terminal electrodes being formed to have a whitish color; a light emitting chip that is mounted with a bonding material on the whitish colored portion of the surface of the substrate and that has a p-side electrode and an n-side electrode electrically connected to the first and second terminal electrodes respectively; and a package for covering the light emitting chip and the periphery thereof.

Here, the whitish color refers to basically white, including other slightly mixed colors such as, for example, cream color.

With this construction in which the LED chip is directly mounted on the whitish portion of the substrate surface of the insulating substrate, the reflection rate of the substrate can be increased so that light with a greater luminosity can be acquired even from a LED chip having the same luminous energy without being regulated by the material of the electrode.

When a whitish material is used as the bonding material by which the LED chip is die-bonded, it is possible to reflect light toward the LED chip side before it reaches the substrate, and consequently to improve the reflection efficiency. With respect to the whitish material, for example, a material prepared by mixing boron nitride (BN) with a transparent epoxy resin may be adopted.

In the case when the LED chip is a bluish-colored chip constituted by layers made of a gallium nitride based compound semiconductor, since the LED chip substrate is made of a transparent sapphire substrate that hardly absorb emitted light, light that has proceeded toward the bottom surface side of the substrate can be utilized more effectively; thus, the effect of the above-mentioned construction becomes greater. Moreover, in the case of a bluish-colored LED chip, since both of the electrodes can be taken out from the surface side, this arrangement is more preferable without the necessity of mounting them on the terminal electrodes.

Here, the "gallium nitride based compound semiconductor" refers to a semiconductor comprising a compound having a group-III element Ga and a group-V element N, wherein part or all of the group-III element Ga may be substituted by other group-III elements such as Al and In and/or part of the group-V element N may be substituted by other group-V elements such as P and As.

With respect to the insulating substrate, a heat-resistant substrate is more preferably applied, since a higher reflection rate can be maintained without causing discoloration due to high temperatures even after use for a long time. Moreover, a ceramic substrate is preferably applied, since it provides a better thermal conductivity, thereby causing no reduction in the light-emitting efficiency of the LED chip even at high temperatures.

Another aspect of the semiconductor light emitting device of the present invention is provided with: first and second conductive members; a light emitting chip; a bonding material die-bonding the light emitting chip on one of the first and second conductive embers; connecting means for electrically connecting two electrodes of the light emitting chip with the first and second conductive members respectively; and a package, made of resin, for covering the light emitting chip and the periphery thereof, wherein the bonding material is made of a whitish material.

The one of the conductive members corresponds to the top portion of a lead, the light emitting chip is die-bonded to the inside of a recessed section of the top portion of the lead, and the light emitting chip is covered with the package having a dome shape; thus, a lamp-type semiconductor light emitting device is obtained.

With respect to the bonding material, a material prepared by mixing boron nitride (BN) with a transparent epoxy resin is used.

DETAILED DESCRIPTION

Figure 1:
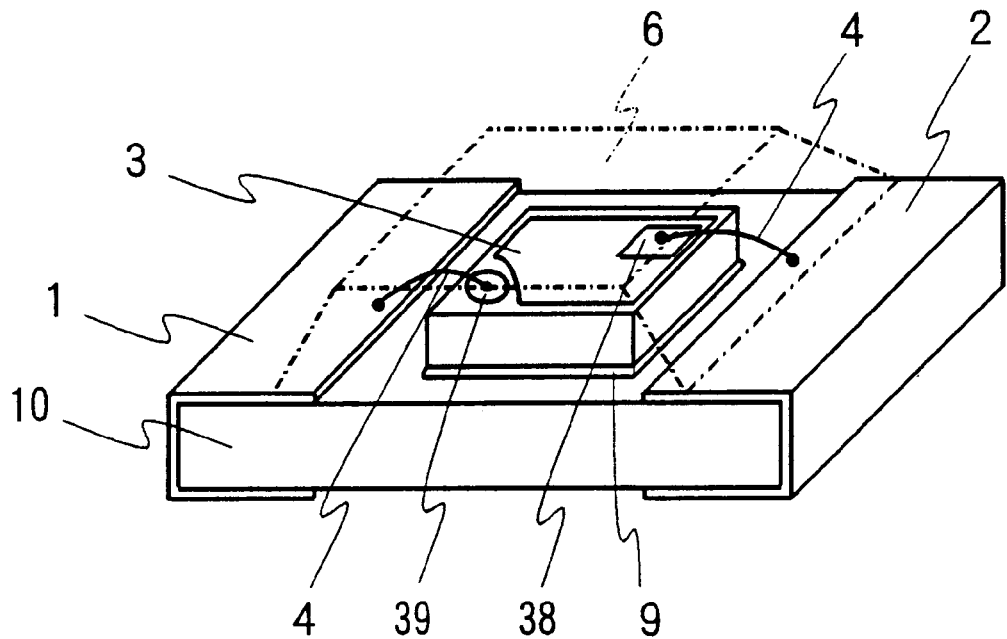
FIG. 1 is an explanatory perspective view showing a chip-type semiconductor light emitting device which is one embodiment of a semiconductor light emitting device of the present invention.

As illustrated in FIG. 1 that is a perspective view of one embodiment thereof, the chip-type semiconductor light emitting device of the present invention is provided with first and second terminal electrodes 1 and 2 installed on both sides of the surface of an insulating substrate 10. A LED chip 3 is directly bonded to the surface of the insulating substrate 10 between the first and second terminal electrodes 1 and 2. The n-side electrode 39 and p-side electrode 38 of the LED chip 3 are respectively connected with the first terminal electrode 1 and the second terminal electrode 2 by metal wires 4 such as gold wires.

The insulating substrate 10 is an insulating substrate made of, for example, a ceramic material such as alumina or alumina nitride, and in the chip-type light emitting device of this type which has to meet the demand for miniaturization, its size is set approximately at 0.8 mm×1.6 mm with a thickness of 0.1 to 0.2 mm. The insulating substrate 10 is preferably designed to have a whitish color so that light rays having colors such as blue, emitted from the LED chip, are reflected without being absorbed. A bluish-colored LED chip 3, whose substrate is made of sapphire and therefore is transparent as will be described later, makes it possible to effectively acquire light that has proceeded toward the back surface side of the LED chip substrate when used in combination with a whitish-colored insulating substrate, thereby providing particularly remarkable effects. It is most preferable to allow the substrate to have a completely white color since the greatest reflection rate is obtained; however, another slightly mixed color such as cream color can be used as long as it is a whitish color basically derived from white. Moreover, it is not necessary for the entire surface of the substrate to have a whitish color as long as at least a portion on which the LED chip is mounted has a whitish color. Furthermore, the insulating substrate 10 is preferably designed to have a heat resistance up to approximately 700° C., like that of ceramics; thus, it becomes possible to avoid discoloration even at elevated temperatures upon application, and also to maintain the white color for a long time.

With respect to the insulating substrate 10, a material having a high thermal conductivity is more preferably used. In other words, upon operation, the LED chip 3 radiates heat to a certain degree. If the radiated heat is not released, the temperature of the LED chip 3 rises, making the semiconductor layer susceptible to degradation. In a conventional construction, since the bonding is made on the terminal electrode, heat that has reached the substrate side of the LED chip is more easily released through the metal of the terminal electrode. However, in the present invention, since the LED chip 3 is directly bonded onto the insulating substrate 10, a material having a high thermal conductivity is preferable adopted in order to efficiently release heat that has reached the substrate side of the LED chip. With respect to such a material having a high thermal conductivity, the aforementioned ceramic materials are most desirable.

As for materials that satisfy the above-mentioned requirements, the ceramic materials are desirable as described above, and among ceramic materials, alumina nitride is more desirable than alumina since it has higher heat-resistance.

Figure 2:
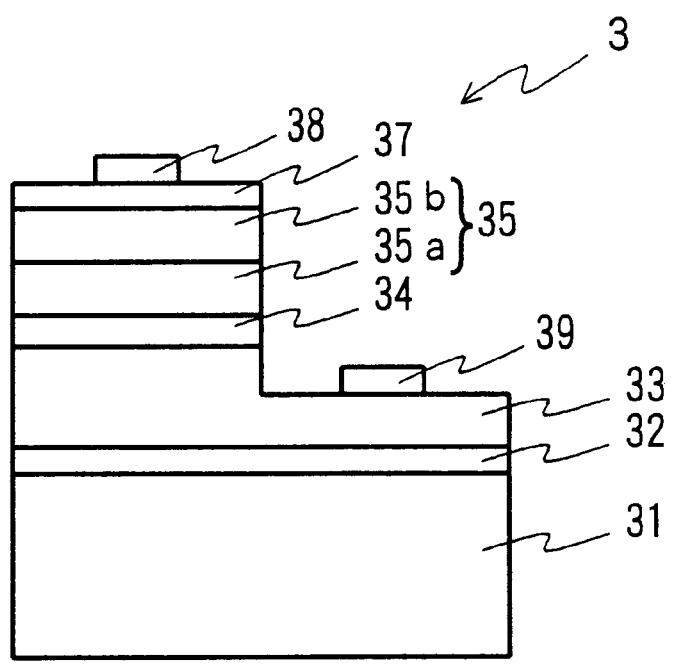
FIG. 2 is an explanatory cross-sectional view showing one example of a LED chip in FIG. 1.

For example, an LED chip having a bluish luminescent color (in the range from ultraviolet to yellow) is formed as the LED chip 3; FIG. 2 is an explanatory cross-sectional view of one example thereof. More specifically, the following layers are successively stacked on the surface of a substrate 31 made of, for example, sapphire ($Al_2O_3$ single crystal) a low-temperature buffer layer 32 made of GaN with a thickness of approximately 0.01 to 0.2 $\mu$m; an n-type layer 33 serving as a clad layer with a thickness of approximately 1 to 5 $\mu$m; an active layer 34 consisting of a semiconductor made from an InGaN based compound semiconductor (which means that the ratio of In and Ga is variable; the same is true hereinafter) with a thickness of approximately 0.05 to 0.3 $\mu$m; and a p-type layer 35 (clad layer) consisting of a p-type semiconductor layer 35a made from an AlGaN based compound (which means that the ratio of Al and Ga is variable; the same is true hereinafter) and a GaN layer 35b, approximately 0.2 to 1 $\mu$m in thickness. Further, a p-side electrode 38 is formed on the surface with a current-diffusing layer 37 interpolated in between. Here, an n-side electrode 39 is formed on the n-type layer 33 at an exposed portion from which the stacked semiconductor layers 33 through 35 have been partially removed.

As illustrated in FIG. 1, this LED chip 3 is bonded on the surface of the insulating substrate 10 between the first terminal electrode 1 and the second terminal electrode 2, in the central portion of the insulating substrate 10, by a bonding agent (bonding material) 9 such as epoxy resin. The bonding agent is preferable provided as a transparent material that does not absorb light that has reached the back surface of the substrate of the LED chip 3; for example, a transparent epoxy resin, etc., is adopted. Moreover, the application of a material prepared by mixing boron nitride (BN) with a transparent epoxy resin allows the bonding material to directly reflect light as well, thereby further improving the reflection rate. Furthermore, the mixed BN remarkably improves the thermal conductivity, as will be described later, so that heat from the LED chip 3 is released toward the substrate 10 side more efficiently; thus, this arrangement is further preferable.

Thereafter, wire-bonding processes are carried out using metal wires 4 such as gold wires so that the n-side electrode 39 and the p-side electrode 38 of the LED chip 3 are electrically connected with the first terminal electrode 1 and the second terminal electrode 2 respectively. Then the LED chip 3 and other members are molded from the periphery thereof by a transparent or milky-colored epoxy resin, etc., that transmits light emitted from the LED chip 3; thus, the chip-type semiconductor light emitting device of the present invention, covered with a package 6, is obtained.

In the present invention, since the LED chip is directly mounted on the whitish-colored insulating substrate, light that has reached the back surface side of the substrate of the LED chip is reflected by the insulating substrate and released toward the surface side. Consequently, the light that has reached the substrate side of the LED chip and that would be absorbed by the terminal electrode in the conventional arrangement is reflected toward the surface side and utilized effectively. As a result, the external light-emitting efficiency, which shows a rate of light to be radiated outward, is improved, and the luminosity can be improved even when the same LED chip is used. Moreover, the application of a whitish-colored substrate as the insulating substrate increases the reflection rate, thereby making it possible to enhance the usability of reflected light, and also to further improve the luminosity. Furthermore, the application of a heat-resistant substrate as the insulating substrate prevents reduction in the luminosity due to discoloration with time, thereby making it possible to improve reliability. The application of a material having a higher thermal conductivity as the insulating substrate also makes it possible to efficiently release heat generated by the LED chip, and consequently to improve the reliability of the LED chip.

In the above-mentioned example, the periphery of the LED chip 3 is covered only by the package 6 made of transparent resin; however, another type providing a reflective case on the further peripheral portion may be adopted with the same effects.

Figure 3:
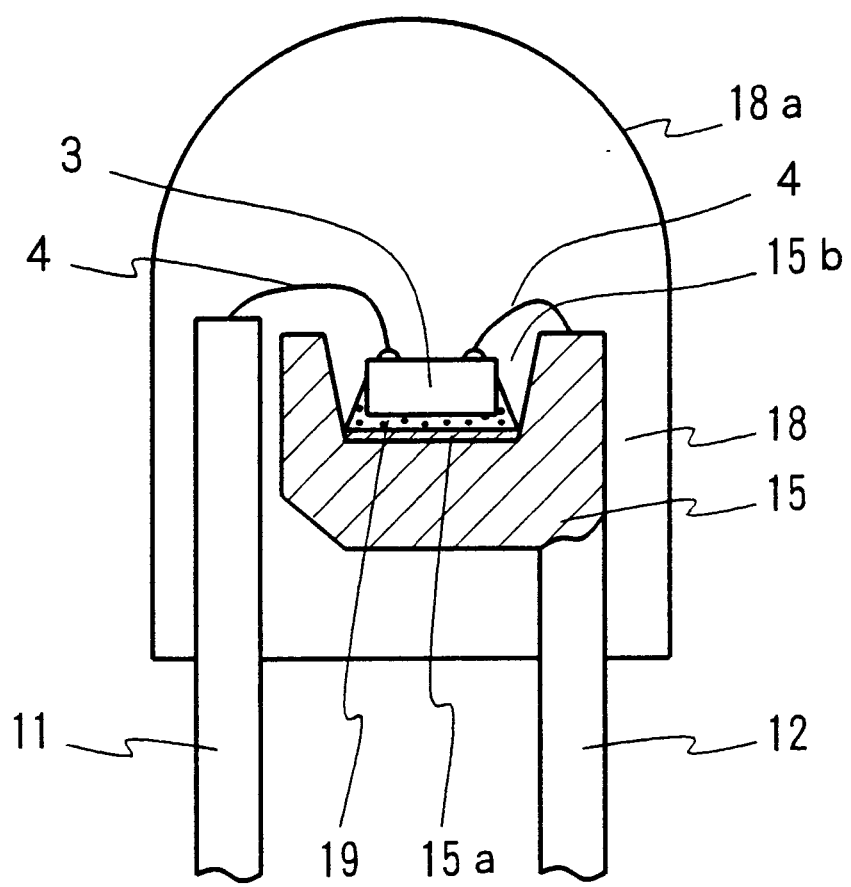
FIGS. 3(a) and 3(b) are explanatory cross-sectional perspective views that show a semiconductor light emitting device of another embodiment of the present invention;.
Figure 3:
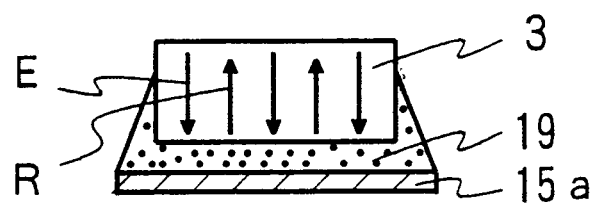
Figure 6:
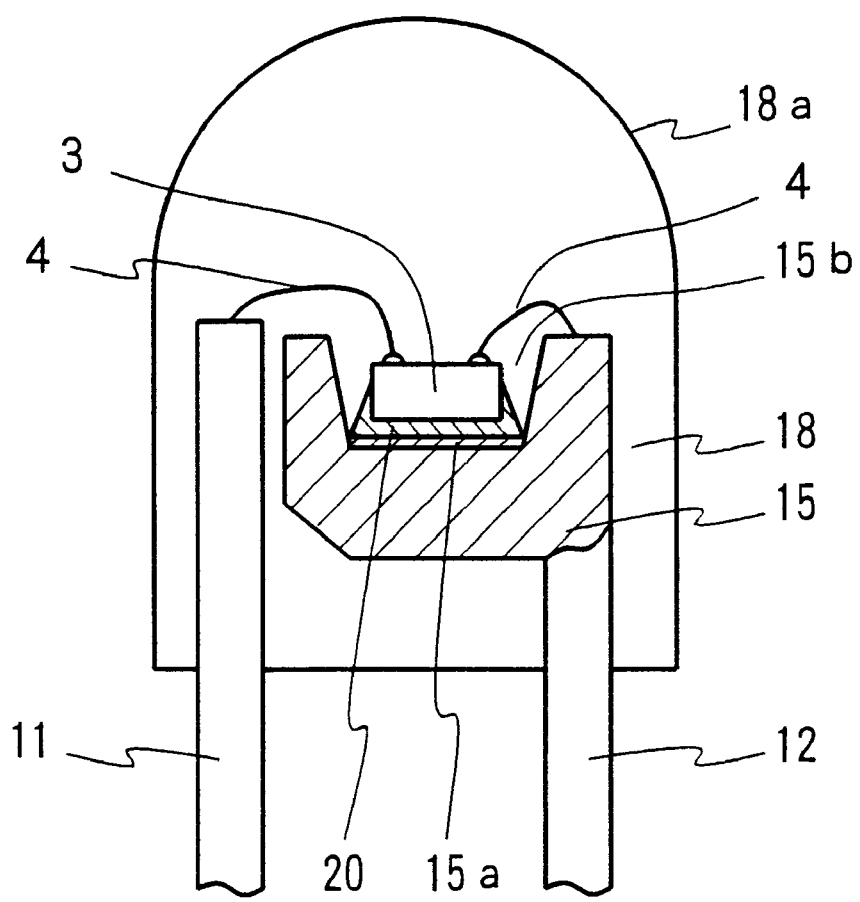
FIGS. 6(a) and 6(b) are explanatory views of a conventional lamp-type semiconductor light emitting device and proceeding direction of light toward the back surface side thereof.
Figure 6:
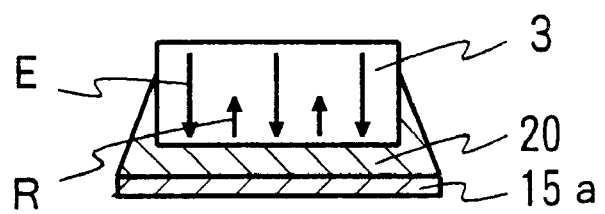

FIG. 3 shows an example of a lamp-type semiconductor light emitting device that is another embodiment of the semiconductor light emitting device of the present invention. In this construction similar to that of FIG. 6(a), a mount section 15 is formed on the end of one of leads 12, a recessed section 15b is formed in the central portion of the mount section, and a LED chip 3 is bonded to the inside of the recessed section 15b by a bonding material 19. Moreover, both of the electrodes of the LED chip 3 are electrically connected with two leads 11 and 12 respectively by metal wires 4, and the peripheral portion is covered with a package 18 made of resin. A hemispherical lens section 18a is formed on its front side. The present invention features that the bonding material 19 used for bonding the LED chip 3 to the inside of the recessed section 15b is provided as a whitish-colored bonding material.

With respect to the white-colored bonding material (paste), for example, a material prepared by mixing BN with a transparent epoxy resin is used. BN, which has a thermal conductivity λ (cal/(m.h.deg)) of 60, has the best property among white pigments. For example, when BN is mixed with a transparent epoxy resin by 60 weight %, the thermal conductivity λ is set at approximately 20. Since the thermal conductivity λ of the transparent resin, as it is, is 0.27, this case increases the thermal conductivity λ to 70 times or more, making it possible to improve the heat diffusion of the LED chip, and consequently to prevent discoloration.

The greater the mixing ratio of BN to the transparent epoxy resin, the greater the thermal conductivity λ. The mixing ratio of BN is preferably set at approximately not less than 50 weight %; however, if the luminous energy of the LED chip is high, the mixing ratio of BN may be decreased. In other words, the mixing ratio of BN to the transparent epoxy resin is appropriately selected depending on the degree of demand for the luminous energy to be radiated from the semiconductor light emitting device.

FIG. 3(b) is an explanatory drawing of a partial cross-section showing a state in which the LED chip 3 is bonded to the recessed section 15b on the top of the lead 112. Since white paste having a great reflection rate is used as the bonding material 19, light E radiated toward the back surface of the LED chip 3 is mostly reflected by the white paste, and forms reflected light R. The reflected light R proceeds straight forward from the upper surface of the LED chip 3, and is refracted by the lens section 18a, and radiated outward. In other words, it becomes possible to reduce the ratio of loss of the light E radiated toward the back surface of the LED chip 3.

Therefore, light radiated outward from the LED chip 3 is equal to the light that proceeds straight forward directly from the LED chip 3 added by the reflected light R that is formed by most of the light E that has radiated toward the back surface; thus, it is possible to increase the luminous energy to be radiated outward from the LED chip 3.

As described above, in the present invention, since the whitish bonding material having a high reflection rate is used as the bonding agent for the LED chip, the luminosity of the lamp-type light emitting device has increased approximately twice as much, as compared with that of the conventional construction using silver paste as the bonding material of the LED chip. Moreover, even when compared with the construction using a transparent epoxy resin as the bonding material of the LED chip, the luminosity has improved approximately by 10%.

Figure 4:
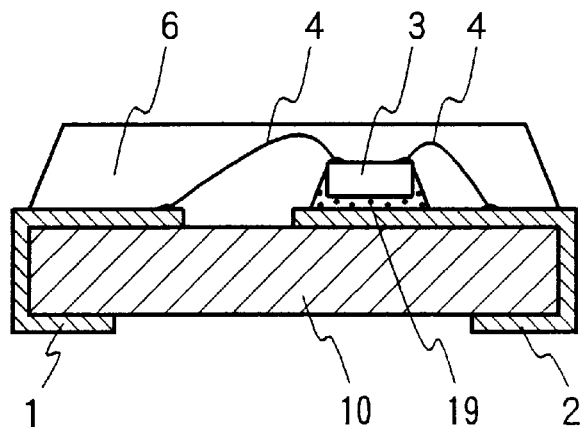
FIG. 4 is an explanatory cross-sectional view that shows a chip-type semiconductor light emitting device of the other embodiment of the present invention.
Figure 5A:
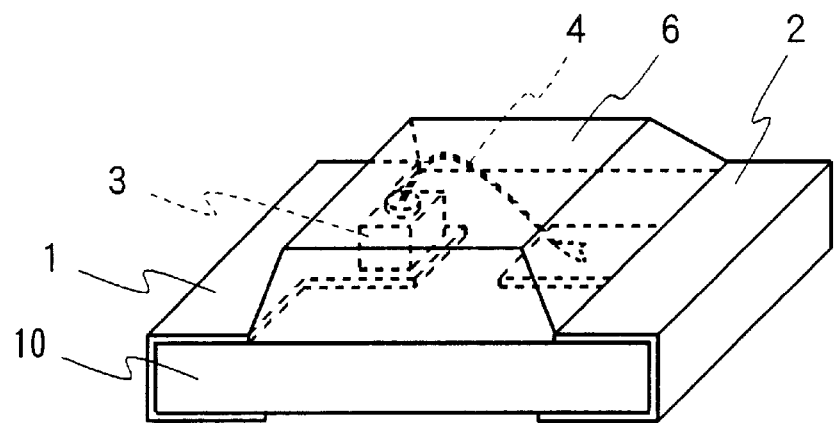
FIGS. 5(a) and 5(b) are explanatory perspective views that show one example of a conventional chip-type semiconductor light emitting device and its LED chip.
Figure 5B:
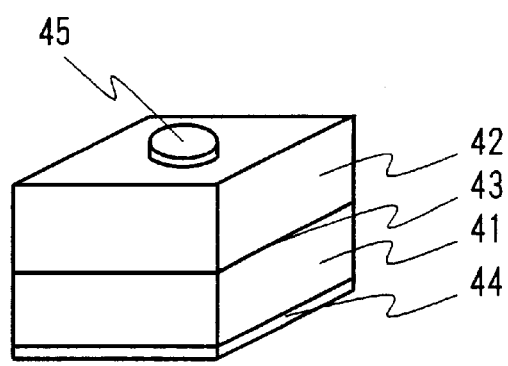

The application of the white paste as the bonding material allows light that has proceeded toward the back surface of the LED chip to be directly reflected by the bonding material; thus, it also makes it possible to increase the luminosity even in the case of the aforementioned chip-type semiconductor light emitting device in which the bonding process is made on one of the terminal electrodes as illustrated in FIG. 4. In other words, FIG. 4 differs from FIG. 1 only in that the LED chip 3 is directly bonded onto the terminal electrode 2 by the bonding material 19 made of the whitish paste, and the other parts are the same as the example of FIG. 1; therefore, an explanation thereof is omitted.

In each of the above-mentioned examples, the light emitting device refers to a bluish-colored semiconductor light emitting device in which a semiconductor made from a gallium nitride based compound semiconductor is used as the light emitting device. In the bluish-colored LED chip using the semiconductor made from a gallium nitride based compound semiconductor, since light absorption tends to be exerted by yellowish colors on the terminal electrodes, and since the substrate of the LED chip is transparent and does not absorb light, greater effects are obtained. Further, since the substrate of the LED chip is an insulating substrate, both n-side and p-side electrodes are installed on the surface side; therefore, this arrangement is more convenient. However, even in the cases of reddish-colored and greenish-colored light emitting devices in which GaAs, AlGaAs, AlGaInP, and InP compounds, etc., are adopted, a material that hardly absorbs emitted light may be used as the substrate of the LED chip.

With the present invention, since light that proceeds toward the back surface side of the LED chip is effectively utilized, it is possible to increase the luminosity with respect to light emission from the same of LED chip. Therefore, particularly in a bluish-colored chip-type light emitting device in which the light-emitting efficiency is low and light absorption tends to be exerted by yellowish-colored materials, the luminosity can be improved efficiently.

Moreover, when a whitish bonding material having a greater thermal conductivity, which is prepared by, for example, mixing BN with a transparent epoxy resin, is adopted as the bonding material of the LED chip, it is possible to release heat from the LED chip efficiently without disturbing heat diffusion from the LED chip, and consequently to prevent discoloration of the bonding material due to heat; thus, it becomes possible to prevent reduction in the efficiency of light emitted outward.

Although preferred example have been described in some detail, it is to be understood that certain changes can be made by those skilled in the art without departing from the spirit and scope of the invention as defined by the appended claims.

What is claimed is:

1. A chip-type semiconductor light emitting device comprising:

an insulating substrate;
   first and second terminal electrodes that are placed at both ends of a surface of said insulating substrate, with at least a portion of said surface of said insulating substrate located between said first and second terminal electrodes being formed to have a whitish color;
   a light emitting chip that is directly mounted with a bonding material on said portion of said surface of said insulating substrate, said light emitting chip having a p-side electrode and an n-side electrode electrically connected to said first and second terminal electrodes respectively, and said light emitting chip having a transparent substrate which is transparent to the light emitted, and said p-side electrode and n-side electrode are both provided on a semiconductor layer side which is laminated on said transparent substrate; and
   a package for covering said light emitting chip and a periphery of said light emitting chip.

2. The semiconductor light emitting device as defined in claim 1, wherein said bonding material is a whitish material.

3. The semiconductor light emitting device as defined in claim 2, wherein said whitish material is prepared by mixing boron nitride (BN) with a transparent epoxy resin.

4. The semiconductor light emitting device as defined in claim 1, wherein said light emitting chip is a chip that is formed by stacking layers made of a gallium nitride based compound semiconductor on a sapphire substrate.

5. The semiconductor light emitting device as defined in claim 1, wherein said insulating substrate is a heat-resistant substrate.

6. The semiconductor light emitting device as defined in claim 1, wherein said insulating substrate is a ceramic substrate.

7. A semiconductor light emitting device comprising:

first and second conductive members;

a light emitting chip;

a bonding material die-bonding said light emitting chip on one of said first and second conductive members;

connecting means for electrically connecting two electrodes of said light emitting chip with said first and second conductive members respectively; and a package, made of resin, for covering said light emitting chip and a periphery of said light emitting chip, wherein said bonding material is made of a whitish material.

8. The semiconductor light emitting device as defined in claim 7, wherein said one of said conductive members corresponds to a top portion of a lead, said light emitting chip is die-bonded to an inside of a recessed section of said top portion of said lead, and said light emitting chip is covered with a package having a dome shape.

9. The semiconductor light emitting device as defined in claim 7, wherein said bonding material is prepared by mixing boron nitride (BN) with a transparent epoxy resin.

10. The semiconductor light emitting device as defined in claim 7, wherein said light emitting chip is a chip that is formed by stacking layers made of a gallium nitride based compound semiconductor on a sapphire substrate.

* * * * *